United States Patent [19]

Quiet et al.

[11] Patent Number: 5,304,952
[45] Date of Patent: Apr. 19, 1994

[54] LOCK SENSOR CIRCUIT AND METHOD FOR PHASE LOCK LOOP CIRCUITS

[75] Inventors: Duane G. Quiet, Gorham; Ray A. Mentzer, Portland, both of Me.

[73] Assignee: National Semiconductor Corporation, Santa Clara, Calif.

[21] Appl. No.: 60,100

[22] Filed: May 10, 1993

[51] Int. Cl.$^5$ .................. H03L 7/089; H03L 7/095
[52] U.S. Cl. .................. 331/1 A; 331/27; 331/DIG. 2
[58] Field of Search ............ 331/1 A, 25, 27, DIG. 2

[56] References Cited

U.S. PATENT DOCUMENTS 3,982,190 9/1976 Schaefer .................. 331/25 X
5,008,635 4/1991 Hanke et al. .................. 331/1 A Primary Examiner—Siegfried H. Grimm
Attorney, Agent, or Firm—Daniel H. Kane; Stephen R. Robinson

[57] ABSTRACT

A lock sensor circuit detects and indicates occurrence of a phase lock condition of an output signal of a phase lock loop (PLL) circuit when the PLL output signal is phase locked to a reference signal. A phase and frequency detector (PFD) has a reference signal input (REF IN) and a feedback signal input (VCO FBK IN) coupled to the output of the PLL circuit. The PFD delivers output UP and DOWN signals according to whether the reference signal leads or lags the feedback signal. A multi-bit up/down counter (FIG. 2) has UP and DOWN inputs coupled to the respective UP and DOWN outputs of the PFD and an m bit output (Q0, Q1, ... Q10). A lock sensor circuit (50) coupled to the m bit up/down counter monitors the nth bit output (QN) of the up/down counter where n<m. A first down counter (F1, F2) counts consecutive output DOWN signals in the absence of an output UP signal. A second up counter (F3, F4) counts consecutive output UP signals in the absence of an output DOWN signal. A lock logic circuit (TLATCH, BLATCH, 64, 66, G7) is coupled through NAND gates (G1, G2) to outputs of the respective first down counter (F1, F2) and second up counter (F3, F4). The lock logic circuit generates an unlock condition indicator signal if consecutive counts of the same signal exceed a specified number and, generates a phase lock condition indicator signal at the LOCK output when no unlock condition is detected.

20 Claims, 5 Drawing Sheets

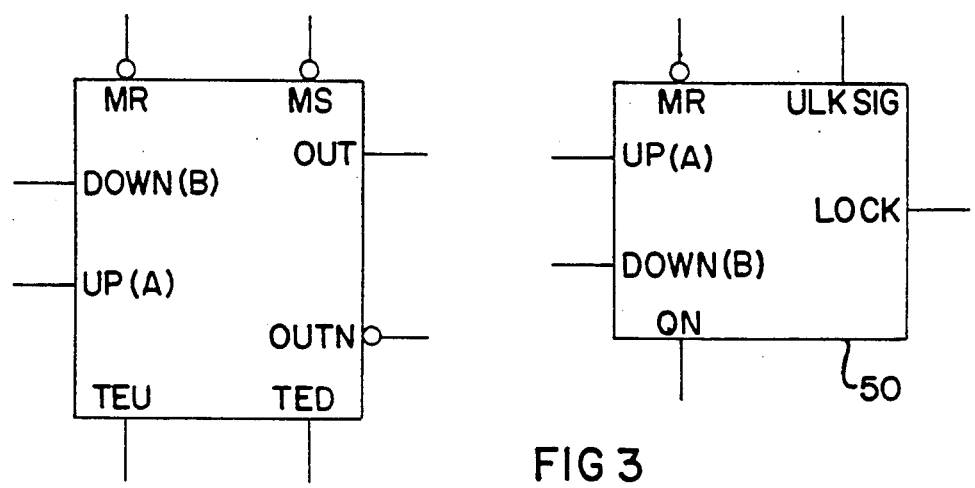
FIG 2A
FIG 3
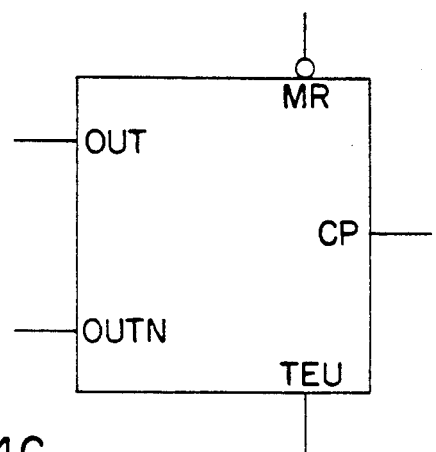
FIG 4C
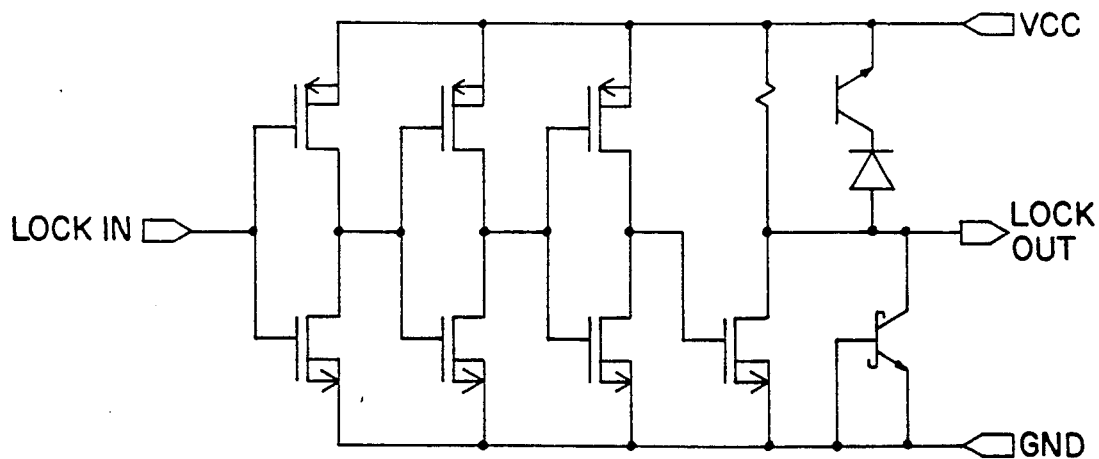
FIG 5

LOCK SENSOR CIRCUIT AND METHOD FOR PHASE LOCK LOOP CIRCUITS

RELATED PATENT APPLICATIONS

This patent is related to the Ray A. Mentzer U.S. patent application Ser. No. 07/980,508 filed Nov. 23, 1992 for CURRENT STARVED INVERTER VOLTAGE CONTROLLED OSCILLATOR; the Julio R. Estrada and Ray A. Mentzer U.S. patent application Ser. No. 07/984,172 filed Nov. 23, 1992 for AUTOMATIC SELECTION OF AN OPERATING FREQUENCY IN A LOW GAIN BROADBAND PHASE LOCK LOOP SYSTEM; and the Ray A. Mentzer, Julio R. Estrada, & Roy L. Yarbrough U.S. patent application Ser. No. 07/980,459 filed Nov. 23, 1992 for BICMOS DIGITAL TO ANALOG CONVERSION USING CURRENT MIRRORS. The related patent applications are assigned to a common Assignee and are incorporated by reference into the present patent specification.

TECHNICAL FIELD

The present invention relates to a new lock sensor circuit for use in phase lock loop (PLL) circuits for sensing occurrence of a phase lock condition or unlock condition at the output of the phase and frequency detector (PFD) of the PLL circuit. The lock sensor circuit provides a reliable phase lock condition indicating signal to other circuits. For example, the invention is applicable to clock signal generating PLL circuits to tell other circuits such as a microprocessor whether to commence using the clock signal generated by the PLL clock driver circuit. More generally, the invention is applicable to any PLL circuit including digital and analog PLL circuits.

RELATED ART

The related U.S. patent applications Ser. No. 980,508, Ser. No. 984,172, and Ser. No. 980,459 describe a new phase lock loop (PLL) clock signal generator or clock driver circuit. This new phase lock loop circuit with new PLL architecture may incorporate the lock sensor circuit of the present invention as hereafter described. However, the lock sensor circuit of the present invention is not limited to the circuits of the related patent applications and can be used in any PLL circuit implementation including digital or analog PLL circuits.

The basic clock driver circuit described in the related patent applications is a PLL ring oscillator using voltage controlled oscillator (VCO) stages. Multiple VCO inverter stages are coupled in series to form the ring oscillator. Alternative parallel feedback paths are provided from each of the VCO stages to the input of the PLL ring oscillator or ring counter. The feedback paths are controlled by respective feedback tristate buffer circuits in the respective parallel feedback loops. To select a frequency range for the PLL circuit, a particular VCO stage and feedback path or loop is selected by enabling one of the feedback buffer circuits. In this respect the PLL ring oscillator is a variable length ring oscillator.

The PLL clock driver circuit incorporates both coarse and fine tuning control. The selection of the length of the PLL ring oscillator constitutes the "coarse" tuning of the PLL clock driver circuit which selects a frequency range for operation of the PLL circuit. The feedback buffer circuit, corresponding feedback path or loop, and corresponding VCO stage of the ring oscillator are selected by a digital word applied at the enable inputs of the respective feedback buffer circuits. Thus the variable length of the PLL ring oscillator is digitally selected.

Each VCO inverter stage (or most of the VCO inverter stages) also have an analog voltage control for restricting current and for fine tuning the frequency and phase for a selected feedback loop within the selected frequency range of the ring oscillator. The VCO inverter stages are controllable "current starved" inverter stages with variable control over current restriction for fine tuning the switching speed of the selected VCO inverter stage. In this respect the PLL ring oscillator is also a variable delay ring oscillator within the selected length or feedback path of the variable length PLL circuit. This permits fine tuning the frequency of operation of the PLL circuit within the selected frequency range.

In summary, the variable length of the ring oscillator provides the coarse tuning of the voltage controlled ring oscillator using digital control signals. The variable delay within the selected feedback path provides the fine tuning of the voltage controlled ring oscillator by controlled current starving or current restriction using analog voltage control signals derived from a digital to analog converter.

According to the new PLL architecture of the related patent applications, a multi-bit up/down counter, for example an 11 bit up/down counter is coupled to the up and down outputs of the phase and frequency detector (PFD) of the PLL circuit. Analog voltage control signals are generated by the eight least significant bits from the 11 bit up/down counter. The 8 bit digital word representing one of 256 possibilities is converted by a DAC for delivering one of 256 analog voltage levels for controlling current starvation or current restriction and therefore switching speed for the selected VCO inverter stage. The analog output of the DAC provides fine tuning of frequency within the selected frequency range of operation of the PLL circuit. Digital control for selection of the length of the PLL ring oscillator and therefore the coarse frequency range is provided by the three most significant bits from the 11 bit up/down counter.

BACKGROUND ART

A conventional phase lock loop incorporates a phase and frequency detector (PFD) with a reference signal input coupled to a reference signal source such as a crystal oscillator providing a stable frequency and phase reference signal. A feedback signal input of the PFD is coupled to the output of the PLL circuit for comparison of the feedback signal with the reference signal. The phase and frequency detector generates output "up" and "down" pulse signals according to whether the reference signal or sync signal leads or lags the feedback signal. Typically, the up and down signals at the output of the PFD are used to drive an analog transistor charge pump and RC loop filter circuit. The duration or pulse width of the "up" and "down" pulse signals is proportional to the skew between the reference signal and feedback signal. The analog charge pump circuit in turn controls the switching speed of current starved inverter stages of a voltage controlled ring oscillator. Varying the switching speed in turn varies the frequency of the feedback signal from the PLL to achieve a "lock" condition between the reference signal and feedback signal.

It would be desirable to sense and detect the occurrence of a phase lock condition at the output of the phase and frequency detector PFD and provide a reliable phase lock condition signal to tell another circuit such as a microprocessor whether to start using the clock signal generated by the PLL clock driver circuit. A disadvantage of prior art lock sensor circuits such as the Motorola 88915 (TM) lock signal output circuit is that the lock signal is ambiguous. The lock indication output signal goes high when the PLL is in a steady state phase and frequency lock condition. However under certain conditions the lock output signal may remain low even though the PLL is in the phase lock condition. Therefore the lock output signal is not suitable to tell other active circuits whether to start using the clock generator signal. The lock output signal can only be used for passive monitoring or evaluation.

OBJECTS OF THE INVENTION

It is therefore an object of the present invention to provide a lock sensor circuit and method for phase lock loop circuits such as clock signal generator circuits and clock driver circuits which provide a reliable phase lock indication signal to end users to commence using the generated clock signal. The lock sensor circuit can therefore be used to initiate and drive other active circuits.

Another object of the invention is to provide a digital lock sensor circuit capable of use with a phase lock loop circuit and capable of responding to a wide range of pulse widths from the up and down outputs of the phase and frequency detector of the PLL circuit. For example the pulse widths of the up and down pulses at the output of the PFD which are proportional to the skew between the reference signal and PLL feedback signal may vary from less than 100pS to several nS. However, the invention is applicable to any pulse width depending on the requirements of the particular application or implementation.

A further object of the invention is to provide a digital lock sensor circuit that checks for all possible unlock conditions of the phase lock loop circuit and generates a phase lock indication circuit if no unlock conditions are present. The invention provides a true and reliable lock indicator signal operative under all circumstances so that an active circuit such as a microprocessor can use the lock sensor signal to tell the microprocessor whether to accept the PLL generated clock signals.

DISCLOSURE OF THE INVENTION

In order to accomplish these results the invention provides a new method for detecting and indicating occurrence of a phase lock condition for output signals at the output of a phase lock loop (PLL) circuit when the PLL output signals are phase locked to a reference signal. The new method also detects and indicates an "unlock" condition. The phase lock loop circuit includes a phase and frequency detector (PFD) having a reference signal input coupled to a reference signal source and a feedback signal input coupled to the output of the PLL circuit. The PFD has an up output and a down output for delivering output up and down pulse signals according to whether the reference signal leads or lags the feedback signal. The PLL circuit uses the output up and down signals to conform the phase and frequency of the feedback signal to the reference signal.

The phase lock condition is characterized by random mixed output up and down signals centering the phase and frequency of the PLL output signal on the reference signal.

According to the invention the steps of the method include counting the number of successive output down pulse signals without an intervening output up pulse signal from the PFD and generating an unlock condition indicator signal if the number of successive output down signal counts without an intervening output up signal count exceeds a specified number. These steps also include counting the number of successive output up signals without an output down signal from the PFD and generating an unlock condition indicator signal if the number of successive output up signal counts without an intervening output down signal count exceeds said specified number. The method proceeds by generating a lock condition indicator signal if no unlock condition is detected.

According to the preferred example the counting step is accomplished by counting successive output down signals or successive output up signals in a multi-bit up/down counter having an m bit output. Occurrence of successive output down signal counts without an intervening output up signal count or occurrence of successive output up signal counts without an intervening output down signal count exceeding the specified number is detected by checking a selected nth bit of the m bit up/down counter where n<m. The step of generating a lock or unlock condition indicator signal is accomplished by logically processing the results of checking the nth bit of the m bit up/down counter. The lock condition indicator signal is generated as long as the nth bit of the m bit up/down counter does not change after a specified number of counts and no other unlock condition is detected. By way of example, the nth bit may be the 4th bit, for example, of an 11 bit up/down counter and the specified number of consecutive similar counts for indicating an unlock condition may be for example in the range of 8-16.

It is noted that the step of counting the number of successive output down signals from the PFD circuit is restarted thereby restarting the count of successive output down signals whenever an output up signal occurs. Similarly the step of counting the number of successive output up signals without an intervening output down signal is restarted thereby restarting the count of successive output up signals upon occurrence of an output down signal. As long as the counting is reset before the critical number of successive similar counts occurs, the "unlock" condition is not reached.

Other events can also cause an "unlock" condition to occur. An asynchronous master reset signal is provided for resetting the multi-bit up/down counter and the counting of output up and down signals from the PFD. The master reset signal generates an unlock condition indicator signal upon resetting the multi-bit up/down counter. A test mode signal also establishes the unlock condition indicator signal.

The invention also provides a new lock sensor and indicator circuit for a phase lock loop circuit. The lock sensor and indicator circuit detects and indicates occurrence of a phase lock condition of an output signal at the output of the PLL circuit when the PLL output signal is phase and frequency locked to the reference signal. The PLL circuit incorporates a phase and frequency detector circuit PFD having the up output and down output for delivering up and down signals according to whether the reference signal leads or lags the feedback signal.

According to the invention the new lock sensor and indicator circuit incorporates a multi-bit up/down counter having up and down, inputs coupled to the respective up output and down output of the PFD. The multi-bit up/down counter has an m bit output for delivering an m bit count. A lock sensor circuit is coupled to the m bit up/down counter. The lock sensor circuit includes a first down counter constructed to count consecutive output down signals in the absence of an intervening output up signal for generating an unlock condition indicator signal if the number of consecutive output down signal counts exceeds a specified number. The reset input of the first down counter is coupled to an up output signal derived from the PFD for restarting the count of consecutive output down signals upon occurrence of an output up signal.

Similarly the lock sensor circuit incorporates a second up counter constructed to count consecutive output up signals in the absence of an output down signal for generating an unlock condition indicator signal after consecutive output up signal counts exceed the specified number. The reset input of the second up counter is coupled to an output down signal derived from the PFD for restarting the count of consecutive output up signals upon occurrence of an output down signal.

The lock sensor circuit also includes a lock logic circuit coupled to the outputs of the first down counter and second up counter. The lock logic circuit generates a phase lock condition indicator, signal when neither the first down counter nor second up counter counts either consecutive output down signal counts or consecutive output up signal counts in excess of the specified number. This assumes of course, that other causes of an "unlock" condition are not present and detected.

In the preferred example embodiment the clock pin of the first down counter is coupled to the nth bit of the m bit up/down counter where n is <m, for counting consecutive output down signals exceeding the specified number at the nth bit. It is an up output signal that is coupled to the reset input of the first down counter for restarting the count of consecutive output down signals upon occurrence of an intervening up signal count. Similarly the second up counter is coupled to the nth bit of the m bit up/down counter where n <m, for counting consecutive output up signals exceeding the specified number at the nth bit. The reset input of the second up counter restarts the count of consecutive output up signals upon occurrence of an output down signal. By way of example the nth bit is the 4th bit of an 11 bit up/down counter and the specified number of consecutive counts resulting in an unlock condition indicator signal is in the range of 8-16.

The lock logic circuit may also incorporate asynchronous inputs such as a master reset input and a test mode signal input for reestablishing an unlock condition indicator signal at the output of the lock sensor circuit.

Other objects, features, and advantages are apparent in the following specification and accompanying drawings.

BRIEF DESCRIPTION OF THE DRAWINGS

FIG. 2A is a detailed block diagram of a flip flop of the multi-bit up/down counter.

FIG. 3 is a block diagram showing the pin diagram for the lock sensor circuit.

FIG. 4A shows the first down counter circuit and second up counter circuit and FIG. 4B shows the lock logic circuit coupled to the outputs of the first down counter and second up counter for generating an unlock condition indicator signal or a lock condition indicator signal. FIG. 4C is a detailed block diagram of a flip flop of the lock sensor circuit.

FIG. 5 is a detailed schematic circuit diagram of a lock condition signal output buffer circuit for increasing fanout and driving other active circuits by the lock condition indicator signal.

DESCRIPTION OF THE PREFERRED EXAMPLE EMBODIMENTS AND BEST MODE OF THE INVENTION

Figure 1:
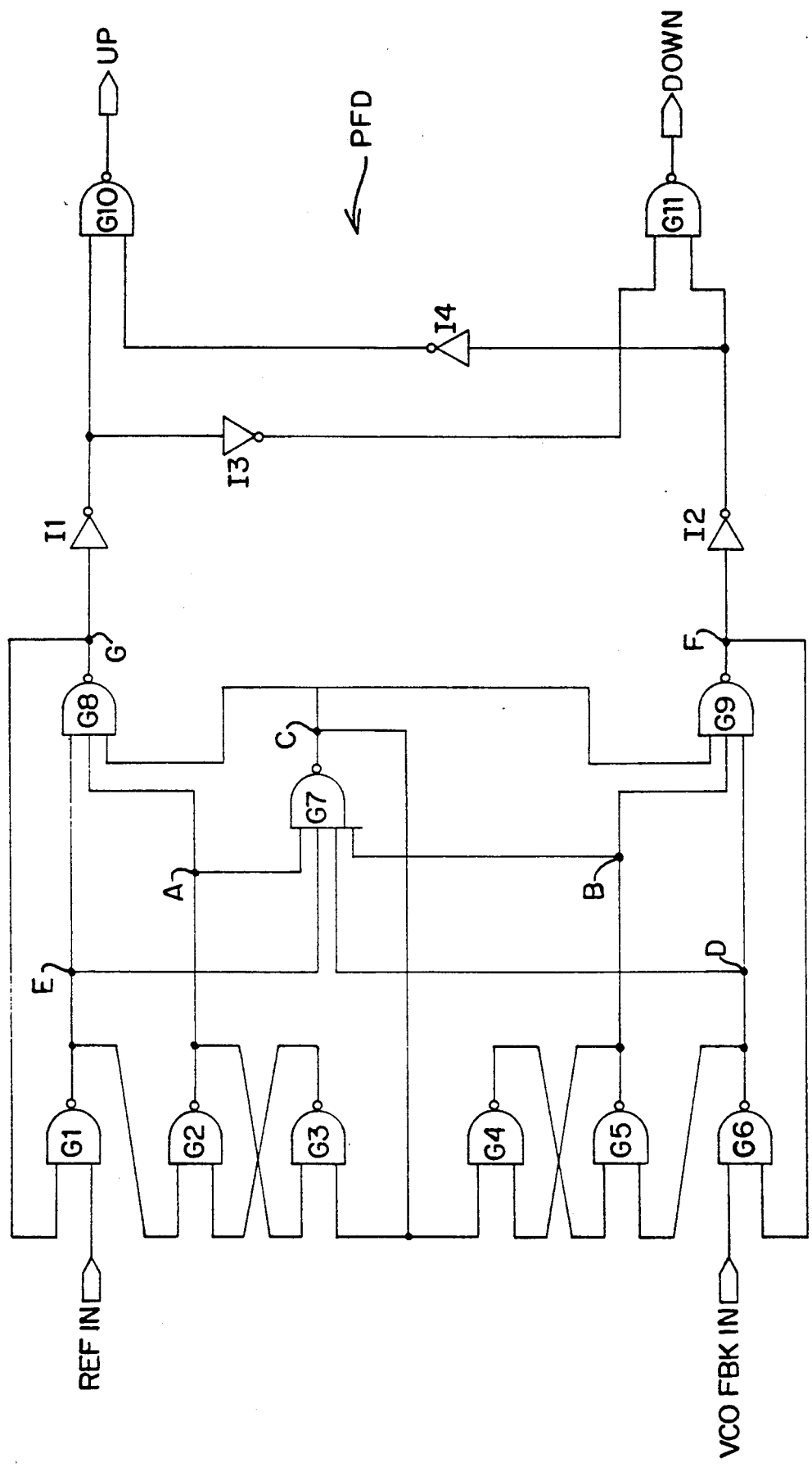
FIG. 1 is a schematic circuit diagram of a phase and frequency detector (PFD) suitable for use with the present invention, having inputs coupled in a phase lock loop circuit of the type described in the related patent applications, and having outputs coupled to the lock sensor circuit of the present invention through the m bit up/down counter.

A phase and frequency detector PFD suitable for use with the present invention is illustrated in FIG. 1. The PFD is incorporated in a PLL circuit of the type described in the related patent applications. The reference input REF IN is coupled to a stable reference signal source such as a crystal oscillator. For example the reference signal source may be a 10MHZ crystal oscillator signal stepped up by a factor of 4 to provide a 40MHz centering reference frequency $f_c$. The feedback signal input VCO FBK IN is coupled to the output of the PLL ring oscillator, that is the last selected VCO stage of the variable length ring oscillator as set forth in the related patent applications. The PFD provides a pulse signal at the UP output if the feedback signal lags behind the center reference frequency $f_c$. The PFD provides a pulse signal at the DOWN output if the feedback signal leads the center reference signal $f_c$. In either case the pulse width is proportional to the skew between the reference signal and feedback signal. For example if the feedback signal is phase shifted 300pS from the reference signal $f_c$, the PFD circuit produces an output pulse signal approximately 300pS wide on the UP output.

Conventionally the UP and DOWN output signals are used to drive a charge pump to increase or decrease the oscillation frequency of a voltage controlled oscillator in the PLL circuit. According to the present invention the UP and DOWN output signals are used in digital circuitry to drive an m bit up/down counter instead of driving an analog charge pump. The PFD circuit of FIG. 1 therefore provides output signals similar to a conventional PFD except that the new PFD circuit of FIG. 1 provides improved control over the pulse width of the UP and DOWN output signals to insure proper operation of the digital m bit up/down counter. To this end the PFD ,circuit is designed for appropriate input bandwidth to provide phase and frequency skew detection over a frequency range suitable for coupling to the up down counter. The input "deadband" area where the input skew cannot be recognized by the PFD circuit is reduced to an acceptable level.

As shown in FIG. 1 the PFD circuit incorporates two latches, an uplatch G1, G8 and a downlatch G6, G9 to detect phase difference between the reference signal and feedback signal. A first SR flip flop G2, G3 and a second SR flip flop G4, G5 detect the frequency difference between the reference signal and feedback signal. The latches are set or reset only on the falling edges of the input signal pulses. During the phase lock condition both the UP and DOWN output signals remain high. The operation of the PFD circuit is as follows.

Assume both the reference signal at REF IN and the feedback signal at FBK IN are at the same frequency with REF IN leading FBK IN by a detectable phase difference. Nodes A and B are both high. Since REF IN leads, REF IN falls while FBK IN is still high and the output of gate G1 at node E undergoes a low to high transition LH. The output of gate G6 at node D remains low and cannot undergo an LH transition until VCO IN falls from high to low. Logic gate G7 therefore has input nodes A, B, D, and E which include a low input and an output, at node C that is high until the LH transition at node D.

The uplatch gate G8 has all input nodes E, A, and C high and a low output at node G. Node G remains low until the HL transition at node C follows the LH transition at node D. The pulse width of the low pulse at the output node G from gate G8 is therefore proportional to the skew between REF IN and FBK IN. A similar pulse smaller in magnitude and width also occurs at node F at the output of downlatch gate G9. This glitch is filtered out by a lockout circuit at the output of the PFD circuit consisting of output gates G10, G11 and the four inverters I1, I2, I3, I4 arranged in a cross coupled network. The lockout circuit G10, G11, I1, I2, I3, I4, guarantees that the low pulse at node G will cause an UP output pulse in the form of a similar low pulse with pulse width proportional to the skew at the output of output gate G10. The DOWN output of the PFD circuit remains high. If FBK IN leads REF IN, the PFD circuit produces a similar low pulse on the DOWN output only. The pulse width is proportional to the skew. The UP output remains high.

In summary if the HL edge of REF IN leads the HL edge of FBK IN by a detectable skew, a low pulse appears at the UP output having a pulse width proportional to the skew. Conversely if the HL edge of FBK IN leads the HL edge of REF IN, a low pulse appears at the DOWN output having a pulse width proportional to the skew. As the skew between the REF IN and FBK IN inputs become smaller, a "dead-band" area is reached where the skew between the inputs can no longer be detected by the PFD circuit. In that case both UP and DOWN outputs remain high. The "dead-band" increases with higher temperature and lower power supply voltage VCC. The "dead-band" becomes smaller with lower temperature and higher power supply voltage VCC. The PFD circuit of FIG. 1 can achieve a dead-band of for example 300pS or less for a 4.5v part.

Figure 2:
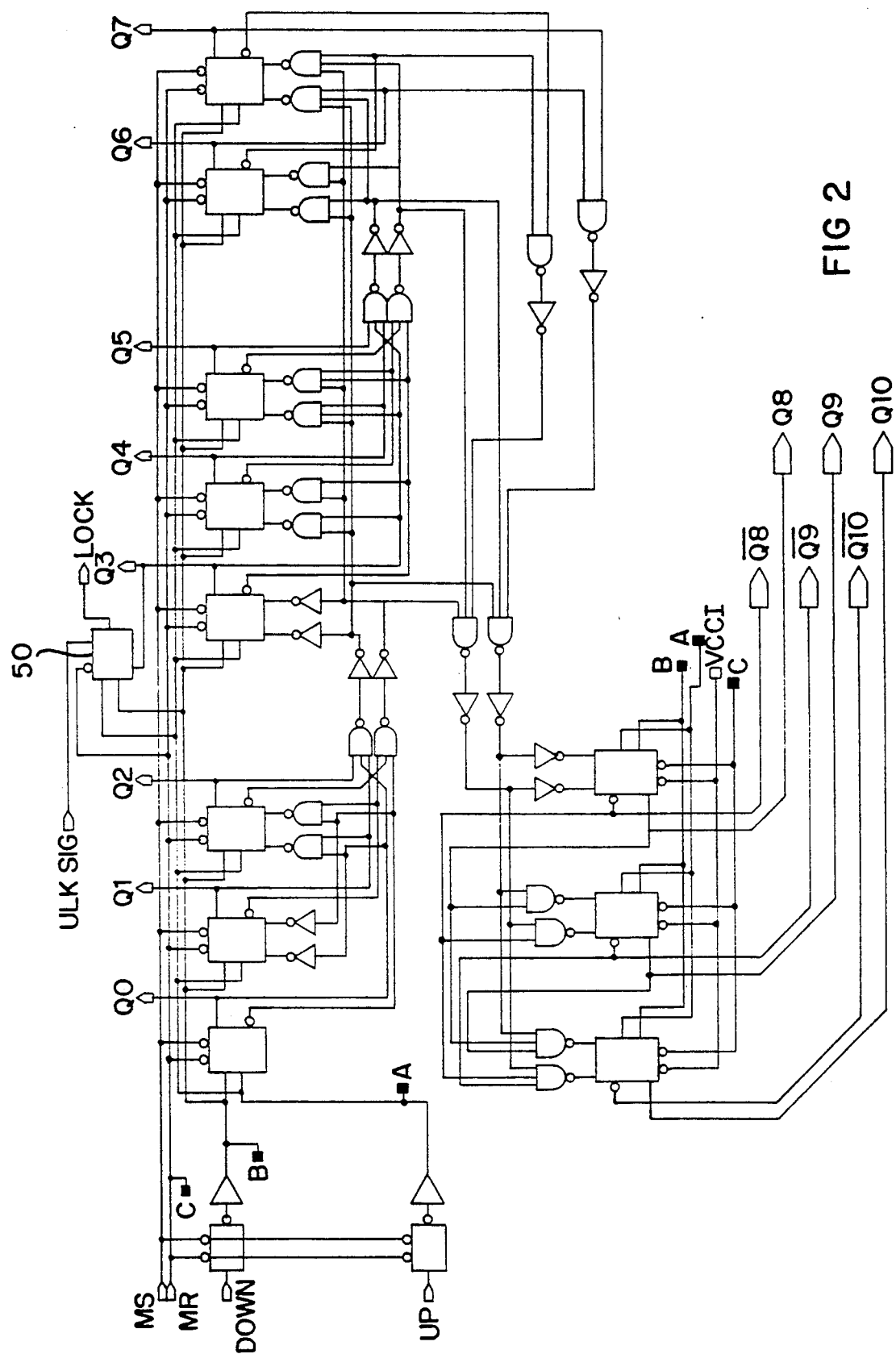
FIG. 2 is a schematic circuit diagram of an 11 bit up/down counter suitable for use in the present invention and having up and down inputs coupled to the up and down outputs of the PFD; having 11 bit outputs coupled in a PLL circuit, for example as described in the related patent applications; and showing the coupling of the lock sensor circuit.

The UP and DOWN outputs of the PFD circuit of FIG. 1 are coupled to the UP and DOWN inputs of a multi-bit digital up/down counter illustrated in FIG. 2. In the example of FIG. 2, the counter is an 11 bit counter with 11 bit outputs Q0, Q1, ... Q10. The counter can be asynchronously set or reset using the master set MS or master reset MR input pins. The three most significant bits (MSB's) Q8, Q9, and Q10 and complements, $\overline{Q8}$, $\overline{Q9}$, and $\overline{Q10}$ are coupled to a decoder, not shown. The decoder generates a digital word which selects the feedback path and corresponding VCO stage in the PLL ring oscillator of the related patent applications. The digital word selects the variable length and corresponding frequency range of the PLL ring oscillator.

The eight least significant bits (LSB's) Q0, Q1, ... Q7 are coupled to a digital to analog converter DAC, not shown. The DAC generates 256 analog voltage steps per frequency range for fine tuning the frequency of the selected length PLL ring oscillator to match the reference signal frequency $f_c$ at the input REF IN of the PFD circuit. The 256 analog voltage levels control the variable delay of the selected VCO inverter stage as set forth in the related patent applications.

In the schematic circuit diagram of FIG. 2, the flip flops across the upper row of flip flops are shown constructed with input pins on the left for DOWN and UP signals coupled respectively to nodes B and A of FIG. 2, complementary output pins OUT and OUTN on the right, master reset MR and master set MS input pins at the top, and clock control pins toggle enable up TEU and toggle enable down TED at the bottom controlled by circuit logic. A detailed pin diagram is shown in FIG. 2A. The flip flops along the lower row of flip flops have the same pinout diagrams but are inverted top to bottom and left to right. The black square nodes show common couplings through the schematic circuit diagram between commonly designated nodes A, B, and C of FIG. 2.

Also coupled to the multi-bit up/down counter of FIG. 2 is the lock sensor circuit 50 for sensing and detecting the lock or unlock condition of the PLL circuit and for generating a lock condition indicating signal at the LOCK output when the PLL circuit is in a phase lock condition. The pin diagram of the lock sensor circuit is shown in more detail in FIG. 3 and includes the UP and DOWN signal input pins coupled respectively to nodes A & B of FIG. 2, a master reset MR signal input pin, a test mode signal ULK SIG input pin and a QN input pin from a selected one of the output bits of the counter circuit. The output pin from the lock sensor circuit 50 is the lock signal LOCK output pin. With respect to FIGS. 2, 2A, and 3 it is noted that when MR and MS are not asserted, the signals A=UP and B=DOWN.

In the example of FIG. 2 the output bit QN of the m bit up/down counter circuit selected for monitoring by the lock sensor circuit 50 is the fourth bit Q3. As hereafter described if the lock sensor circuit senses consecutive UP count signals without an intervening DOWN count signal or senses consecutive DOWN count signals without an intervening UP count signal in excess of 8-16 counts determined by monitoring Q3, then the lock sensor circuit 50 issues an unlock condition signal at the lock signal output LOCK. A phase lock condition of the PLL ring oscillator circuit is effectively indicated by random UP and DOWN counts with consecutive similar counts not exceeding the selected number for example, in the range of 8-16 counts. Thus no change in Q3 after specified number of counts causes a lock condition indicator signal at the LOCK output absent any other causes for an unlock condition. Both the master reset signal MR and the test mode signal ULKSIG effectively reset the lock sensor circuit and cause an unlock condition indicator signal to appear at the LOCK output.

In the examples of FIG. 1 and 2 with a reference signal frequency $f_c$ of 40MHz, the feedback signal at FBK IN during the phase lock condition may wander for example back and forth within the frequency range of 39.98MHz–40.02MHz as a result of dither or quantization error. The UP and DOWN outputs of the PFD circuit may typically alternate between one or two consecutive UP counts and one or two consecutive DOWN counts. If the number of consecutive state changes of consecutive single bits at the same output is excessive beyond the specified number determined by the monitored bit QN then the failure of the phase lock is indicated.

Figure 4A:
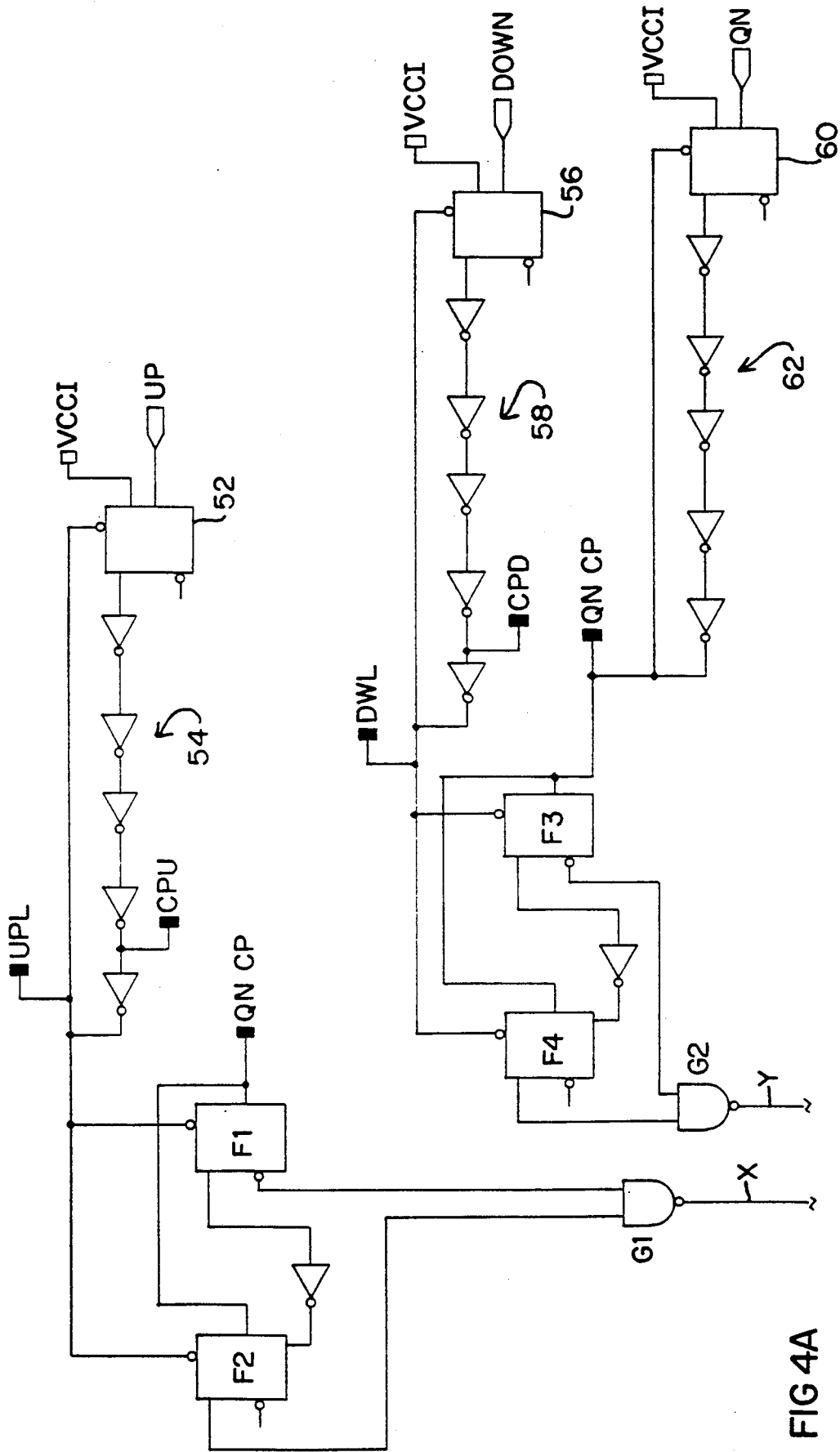
FIGS. 4A and 4B are detailed schematic circuit diagrams of the lock sensor circuit in two parts joined at lines X and Y.
Figure 4B:
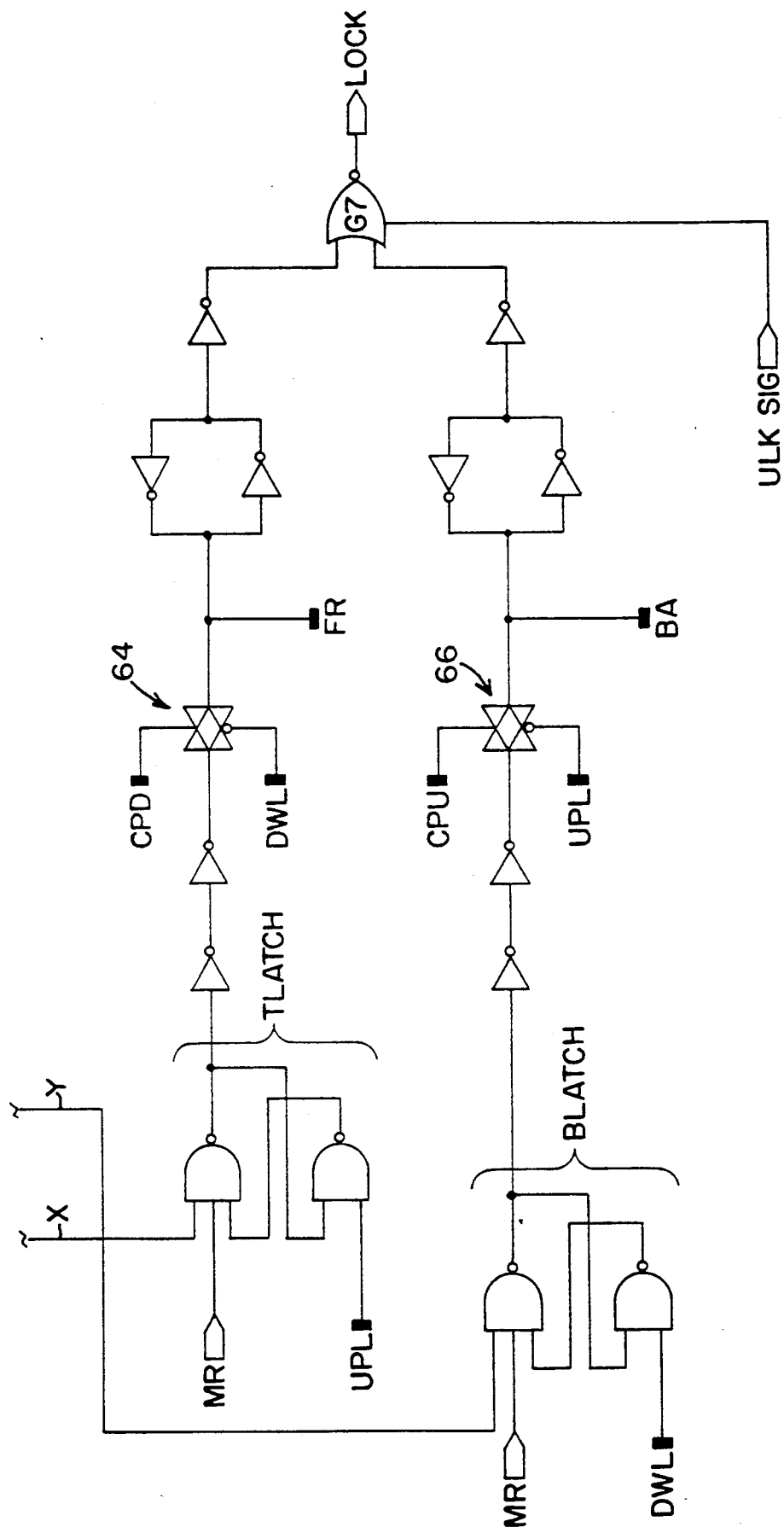

A detailed circuit diagram of an example implementation of the lock sensor circuit 50 is illustrated in two parts shown in FIGS. 4A and 4B joined together at lines X and Y. According to the lock sensor and detector circuit of FIGS. 4A and 4B, the PLL, ring oscillator circuit is defined as being "unlocked" or in the unlock condition when any one of the following four conditions is satisfied. An unlock condition is indicated by a low potential level unlock condition indicator signal at the LOCK output. First the PLL circuit is unlocked when the number of DOWN count pulses without an UP count pulse exceeds a given number determined by the output bit QN of the multi-bit up/down counter of FIG. 2 selected for monitoring. In the example of FIG. 2 the fourth bit Q3 is selected for monitoring and the threshold number which if exceeded indicates an unlock condition is in the range of 8-16.

Second the PLL circuit is unlocked when the number of UP count pulses without an intervening DOWN count pulse exceeds the specified number determined by the counter output bit QN selected for monitoring. Third the PLL circuit is unlocked when the master reset signal MR is asserted. The PLL circuit cannot attain the lock condition if the MR pin is held low. Fourth the PLL circuit is unlocked if the PLL circuit is in the test mode when the test mode signal ULKSIG is low.

The lock sensor circuit 50 of FIGS. 4A and 4B tests these four "unlock" conditions as hereafter described. If none of the "unlock" conditions apply, then the LOCK output of the lock sensor circuit goes high providing a "lock" condition indicator signal for the PLL circuit. The "lock" condition is therefore defined as the absence or negation of all the possible "unlock" conditions.

Referring generally to FIG. 4A, the UP and DOWN inputs of the lock sensor circuit 50 are derived from the UP and DOWN outputs of the PFD circuit and UP and DOWN inputs of the multi-bit up/down counter of FIGS. 1 and 2 described above. The UP and DOWN signal pulses have pulsewidths proportional to the skew between reference and feedback signals and the pulsewidths may vary for example from less than 100 pS to several nS. To accommodate and compensate for this pulsewidth variation, the UP input is coupled to the clock pin of a D type flip flop 52 having the data input tied to the high potential power rail VCCI. The output of flip flop 52 is coupled to an inverter chain 54. Circuit 52, 54 is a pulse stretch circuit which provides a "stretched" UP pulse UPL having a duration at least as long as the delays of the inverter chain 54. The resulting signal UPL is suitable for resetting two bit counter F1, F2.

Similarly, the DOWN input is coupled to the clock input pin of a D type flip flop 56 having its data input tied to the high potential power rail VCCI. The output of flip flop 56 is coupled to inverter chain 58. The pulse stretch circuit 56, 58 provides a "stretched" DOWN pulse DWL having a duration at least as long as the delays of inverter chain 58. Signal DWL is suitable for resetting two bit counter F3, F4. The input QN is the bit from the output of the multi-bit up/down counter of FIG. 2 selected for monitoring. In the illustrated example the fourth bit Q3 is selected for monitoring to determine whether or not consecutive UP counts or DOWN counts exceed 8-16 in number.

Input signal QN is similarly processed by pulse stretch circuit 60, 62 to provide a clock pulse QN signal QN CP coupled to the clock input pins of two bit counters F1, F2, and F3, F4.

In order to check for the first unlock condition caused by consecutive DOWN counts without an intervening UP count exceeding the specified number (for QN=Q3 the specified number is in the range of 8-16), a first two bit counter F1, F2 is driven by QN CP but is reset whenever an UP count occurs and the UP count reset signal UPL is low. Thus, the first counter F1, F2 determines how many times QN has switched before an UP count occurs. The outputs of the flip flops F1 and F2 of the counter F1, F2 are coupled to the inputs of NAND gate G1. The output of NAND gate G1 goes low after three state changes in counter F1, F2 (00, 01, 10). If the G1 output goes low before the counter is reset by an UP signal UPL, the PLL circuit is in the "unlock" condition.

Similarly, the second unlock condition caused by consecutive UP counts without an intervening down count exceeding the specified number is tested by a second two bit counter F3, F4 which also checks the selected bit QN for consecutive UP counts using the QN clock pulse signal QN CP. Two bit counter F3, F4 is reset by the DOWN reset signal DWL. The output of NAND gate G2 goes low when there are too many UP counts exceeding the specified number without an intervening DOWN count. A detailed pin diagram of flip flops F2 and F4 is shown by way of example in FIG. 4C.

FIG. 4B shows the remaining logic circuitry of the lock sensor circuit 50 for processing the outputs of NAND gates G1 and G2 and also for checking the other "unlock" conditions. For a low potential level signal at the output of G1 indicating an "unlock" condition, the output of the upper NAND gate latch TLATCH is set high. The high output signal passes through the inverter stages and passgate 64 upon occurrence of the next stretch DOWN pulse DWL, to one input of the output NOR gate G7. The LOCK output signal at the output of NOR gate G7 goes low providing an "unlock" condition indicating signal. Referring to the TLATCH of FIG. 4B, it is noted that TLATCH is also reset by an UP reset signal UPL, as well as by the output of NAND gate G1.

Similarly, for a low potential level signal at the output of NAND gate G2, the bottom latch BLATCH is set high. The high output signal passes through the inverter stages and passgate 66 upon occurrence of the next stretch UP pulse UPL. The LOCK output at the output of NOR gate G7 goes low providing the "unlock" condition indicating signal. BLATCH is reset by any stretch DOWN pulse DWL as well as by the output of G2.

The third "unlock" condition is tested by checking the master reset input MR of the NAND gate latches TLATCH and BLATCH. A low MR signal sets the outputs of TLATCH and BLATCH high. Nodes FR and BA are coupled to the high potential power rail through appropriate MR signal actuated PMOS passgates to assure that both latch outputs are set high. The LOCK output of NOR gate G7 is therefore low providing an "unlock" condition indicator signal. The LOCK output remains low as long as the low MR signal is asserted.

The fourth unlock condition is checked at the ULK SIG enable input of output NOR gate G7. At the PLL circuit the voltage controlled ring oscillator is disabled in the test mode when ULK SIG goes high. The lock sensor circuit 50 LOCK output from NOR gate G7 is then held low providing the "unlock" condition indicator signal while the PLL circuit is in the test mode. Only when all "unlock" condition tests are negative is the LOCK output of lock sensor circuit 50 at high potential level providing the phase lock condition indicating symbol.

While the invention has been described with reference to particular example embodiments it is intended to cover all modifications and equivalents within the scope of the following claims.

We claim:

1. A method for detecting and indicating occurrence of a phase lock condition for output signals at the output of a phase lock loop (PLL) circuit when the PLL output signals are phase locked to a reference signal, and for detecting and indicating an unlock condition, said PLL circuit comprising a phase and frequency detector (PFD) having a reference signal input (REF IN) coupled to a reference signal source and a feedback signal input (VCO FBK IN) coupled to the output of the PLL circuit, said PFD having an up output (UP) and a down output (DOWN) for delivering output up and down signals according to whether the reference signal leads or lags the feedback signal, said phase lock condition being characterized by random mixed output up and down signals centering the PLL output signal on the reference signal, comprising:

counting the number of successive output down signals without an intervening output up signal from the PFD and generating an unlock condition indicator signal if the number of successive output down signal counts without an output up signal count exceeds a specified number;

counting the number of successive output up signals without an intervening output down signal from the PFD and generating an unlock condition indicator signal if the number of successive output up signal counts without an output down signal count exceeds said specified number;

and generating a lock condition indicator signal if no unlock conditions are detected.

2. The method of claim 1 comprising the additional steps:

counting output up and down signals from the PFD in a multi-bit up/down counter (FIG. 2);

resetting the multi-bit up/down counter using a master reset signal (MR);

and generating an unlock condition indicator signal upon resetting the multi-bit up/down counter using a master reset signal (MR).

3. The method of claim 1 wherein the step of counting the number of successive output down signals without an output up signal from the PFD comprises counting said successive output down signals in a multi-bit up/down counter having an m bit output (Q0, Q1, ... Q10) and detecting occurrence of successive output down signal counts without an output up signal count exceeding a specified number by checking a selected nth bit output (QN) of the m bit up/down counter where $n < m$.

4. The method of claim 3 wherein the step of counting the number of successive output up signals without an output down signal comprises counting the up signals in said multi-bit up/down counter of m bits and detecting occurrence of successive output up signal counts without an output down signal count exceeding said specified number by checking the nth bit of the m bit output (QN) up/down counter.

5. The method of claim 4 wherein the step of generating a lock condition indicator signal comprises logically processing the results of checking the nth bit output (QN) of the m bit up/down counter and generating said lock condition indicator signal as long as the nth bit of the m bit up/down counter does not change after a specified number of counts.

6. The method of claim 4 wherein the step of counting the number of successive output down signals without an output up signal from the PFD comprises restarting the count of successive output down signals upon occurrence of an output up signal.

7. The method of claim 6 wherein the step of counting the number of successive output up signals without an output down signal comprises restarting the count of successive output up signals upon occurrence of an output down signal.

8. The method of claim 3 wherein $m = 11$ and the nth bit output (QN) is the 4th bit (Q3).

9. The method of claim 5 wherein the nth bit output (QN) is the 4th bit (Q3) and wherein the specified number is in the range of approximately 8-16.

10. A lock sensor and indicator circuit for a phase lock loop (PLL) circuit for detecting and indicating occurrence of a phase lock condition of an output signal at the output of the PLL circuit when the PLL output signal is phase locked to a reference signal, and for detecting and indicating an unlock condition, said PLL circuit comprising a phase and frequency detector (PFD) having a reference signal input (REF IN) coupled to a reference signal source and a feedback signal input (VCO FBK IN) coupled to the output of the PLL circuit, said PFD having an up output (UP) and a down output (DOWN) for delivering output up and down signals according to whether the reference signal leads or lags the feedback signal, said phase lock condition being characterized by random mixed output up and down signals centering the PLL output signal on the reference signal, comprising:

a multi-bit up/down counter (FIG. 2) having up and down inputs (UP, DOWN) coupled to the respective up output (UP) and down output (DOWN) of the PFD, said multi-bit up/down counter having an m bit output (Q0, Q1, ... Q10) for delivering an m bit count;

and a lock sensor circuit (50) coupled to the m bit up/down counter, said lock sensor circuit comprising a first down counter (F1, F2) constructed to count consecutive output down signals in the absence of an output up signal for generating an unlock condition indicator signal if the number of consecutive output down signal counts exceeds a specified number;

said lock sensor circuit (50) also comprising a second up counter (F3, F4) constructed to count consecutive output up signals in the absence of an output down signal for generating an unlock condition indicator signal after consecutive output up signal counts exceed the specified number;

said lock sensor circuit (50) further comprising a lock logic circuit (TLATCH, BLATCH, 64, 66, G7) coupled to the outputs of the first down counter (F1, F2) and second up counter (F3, F4) for generating a phase lock condition indicator signal when no unlock condition is detected.

11. The lock sensor and indicator circuit of claim 10 further comprising a master reset input (MR) coupled to the lock logic circuit of the lock sensor circuit, said lock logic circuit (TLATCH, BLATCH, 64, 66, G7) being constructed to generate an unlock condition indicating signal upon occurrence of a master reset signal.

12. The lock sensor and indicator circuit of claim 10 wherein the first down counter (F1, F2) is coupled to the nth bit output (QN) of the m bit up/down counter (FIG. 2) where n<m, for counting consecutive output down signals exceeding said specified number at the nth bit (QN), and wherein said first down counter comprises a restart input coupled to the up input (UPL) for restarting the count of consecutive output down signals upon occurrence of an output up signal.

13. The lock sensor and indicator circuit of claim 12 wherein the second up counter (F3, F4) is coupled to the nth bit output (QN) of the m bit up/down counter where n<m, for counting consecutive output up signals exceeding said specified number at the nth bit (QN), and wherein said second up counter comprises a restart input coupled to the down input (DWL) for restarting the count of consecutive output up signals upon occurrence of an output down signal.

14. The lock sensor and indicator circuit of claim 13 wherein the first down counter (F1, F2) of the lock sensor circuit (50) comprises a first two bit counter having a clock input coupled to the nth bit output (QN) of the m bit up/down counter, and having outputs coupled to the inputs of a first NAND gate (G1).

15. The lock sensor and indicator circuit of claim 14 wherein the second up counter (F3, F4) of the lock sensor circuit (50) comprises a second two bit counter (F3, F4) having a clock input coupled to the nth bit output (QN) of the m bit up/down counter and having outputs coupled to the inputs of a second NAND gate (G2).

16. The lock sensor and indicator circuit of claim 15 wherein the first and second NAND gates (G1, G2) are coupled to the lock logic circuit, said lock logic circuit comprising first and second latches (TLATCH, BLATCH) having inputs coupled to the respective first and second NAND gates (G1, G2), said first and second latches having outputs coupled through respective first and second passgates (64, 66) to a lock signal output NOR gate (G7).

17. The lock sensor and indicator circuit of claim 10 wherein the nth bit (QN) is the 4th bit (Q3).

18. The lock sensor and indicator circuit of claim 17 wherein the specified number is in the range of approximately 8-16.

19. A lock sensor and indicator circuit for a phase lock loop (PLL) circuit for detecting and indicating occurrence of a phase lock condition of an output signal at the output of the PLL circuit when the PLL output signal is phase locked to a reference signal, and for detecting and indicating an unlock condition, said PLL circuit comprising a phase and frequency detector (PFD) having a reference signal input (REF IN) coupled to a reference signal source and a feedback signal input (VCO FBK IN) coupled to the output of the PLL circuit, said PFD having an up output (UP) and a down output (DOWN) for delivering output up and down signals according to whether the reference signal leads or lags the feedback signal, said phase lock condition being characterized by random mixed output up and down signals centering, the PLL output signal on the reference signal, comprising:

a multi-bit up/down counter (FIG. 2) having up and down inputs (UP, DOWN) coupled to the respective up output (UP) and down output (DOWN) of the PFD, said multi-bit up/down counter having an m bit output (Q0, Q1, ... Q10) for delivering an m bit count;

and a lock sensor circuit (50) coupled to the m bit up/down counter, said lock sensor circuit comprising a first down counter (F1, F2) coupled to the nth bit output (QN) of the m bit up/down counter where n<m, said first down counter (F1, F2) being constructed to count consecutive output down signals at the nth bit (QN) of the m bit up/down counter in the absence of an output up signal for generating an unlock condition indicating signal if the number of consecutive output down signal counts exceeds the specified number represented by the first n bits of the m bit up/down counter;

said lock sensor circuit (50) also comprising a second up counter (F3, F4) coupled to the nth bit output (QN) of the m bit up/down counter said second up counter being constructed to count consecutive output up signals at the nth bit (QN) of the m bit up/down counter in the absence of an output down signal for generating an unlock condition indicator signal after consecutive output up signal counts exceed the specified number represented by the first n bits of the m bit up/down counter;

said lock sensor circuit (50) further comprising a lock logic circuit (TLATCH, BLATCH, 64, 66, G7) coupled to the outputs of the first down counter (F1, F2) and second up counter (F3, F4) for generating a phase lock condition indicating signal when no unlock condition is detected;

wherein the first down counter (F1, F2) of the lock sensor circuit (50) comprises a first two bit counter (F1, F2) having a clock input coupled to the nth bit output (QN) of the m bit up/down counter, and having outputs coupled to the inputs of a first NAND gate (G1);

wherein the second up counter (F3, F4) of the lock sensor circuit (50) comprises a second two bit counter (F3, F4) having a clock input coupled to the nth bit output (QN) of the m bit up/down counter and having outputs coupled to the inputs of a second NAND gate (G2);

wherein the first and second NAND gates (G1, G2) are coupled to the lock logic circuit, said lock logic circuit comprising first and second latches (TLATCH, BLATCH) having inputs coupled to the respective first and second NAND gates (G1, G2), said first and second latches having outputs coupled through respective first and second passgates (64, 66) to a lock signal output NOR gate (G7).

20. The lock sensor and indicator circuit of claim 19 further comprising master reset inputs (MR) coupled to the respective first and second latches (TLATCH, BLATCH) of the lock logic circuit, said lock logic circuit being constructed to generate an unlock condition indicating signal upon occurrence of a master reset signal;

and a test mode signal input (ULK SIG) coupled to the output NOR gate (G7) of the lock logic circuit, said lock logic circuit being constructed to generate an unlock condition indicating signal upon occurrence of a test mode signal.

* * * * *